(12) United States Patent
Wu

(10) Patent No.: US 8,586,406 B1
(45) Date of Patent: Nov. 19, 2013

(54) METHOD FOR FORMING AN OXIDE THIN FILM TRANSISTOR

(71) Applicant: Chunghwa Picture Tubes, Ltd., Taoyuan (TW)

(72) Inventor: Der-Chun Wu, New Taipei (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 13/789,641

(22) Filed: Mar. 7, 2013

(30) Foreign Application Priority Data

Oct. 18, 2012 (TW) .............................. 101138426 A

(51) Int. Cl.
*H01L 21/00* (2006.01)
*H01L 21/16* (2006.01)

(52) U.S. Cl.
USPC ......................................................... 438/104

(58) Field of Classification Search
USPC ......................................................... 438/104
See application file for complete search history.

(56) References Cited

U.S. PATENT DOCUMENTS

| 2002/0184999 | A1 | 12/2002 | Hasegawa et al. | |
|---|---|---|---|---|
| 2010/0163876 | A1* | 7/2010 | Inoue et al. | ..................... 257/59 |
| 2010/0314634 | A1* | 12/2010 | Chiu | ............................... 257/88 |
| 2011/0117707 | A1* | 5/2011 | Lin et al. | ....................... 438/158 |

FOREIGN PATENT DOCUMENTS

TW        I322507 B    3/2010

\* cited by examiner

*Primary Examiner* — Charles Garber
*Assistant Examiner* — Brigitte Paterson
(74) *Attorney, Agent, or Firm* — CKC & Partners Co., Ltd.

(57) ABSTRACT

A method for forming an oxide thin film transistor is provided. A gate electrode, a semiconductor insulation layer and a metal oxide layer is sequentially disposed on a substrate. A first patterned photo-resist layer is disposed on the metal oxide layer using a gray-level mask. The first patterned photo-resist layer is used as a mask to etch the metal oxide layer to form a patterned metal oxide layer. A part of the first patterned photo-resist layer is removed to form a second patterned photo-resist layer. A metal layer is formed and a third patterned photo-resist layer is used as a mask to etch the metal layer to form a source region and a drain region and to expose the second patterned photo-resist layer. The third patterned photo-resist layer and a part of second patterned photo-resist layer are removed to form a fourth patterned photo-resist layer.

9 Claims, 6 Drawing Sheets

METHOD FOR FORMING AN OXIDE THIN FILM TRANSISTOR

RELATED APPLICATION

This application claims priority to Taiwan Application Serial Number 101138426, filed Oct. 18, 1012, which is herein incorporated by reference.

TECHNICAL FIELD

The present disclosure relates to a method for forming a transistor, and more particularly to a method for forming an oxide thin film transistor.

BACKGROUND

In recent years, flat panel displays have gradually replaced conventional cathode ray tube displays. Current flat panel displays include organic light-emitting diode (OLED) displays, plasma display panels (PDPs), crystal displays (LCDs), field emission displays (FEDs), and some other less well-known display configurations. An essential component of these flat panel displays is the thin-film transistor (TFT), which controls the on and off state of each pixel.

Referring to FIG. 1, which schematically illustrates a cross-sectional view of a conventional metal oxide thin film transistor structure, the conventional metal oxide thin film transistor structure 10 includes a substrate 101, a gate electrode 102 disposed on the substrate 101, a semiconductor insulation layer 103 disposed on the substrate 101 and the gate electrode 102, a metal oxide layer 104 disposed on the semiconductor insulation layer 103, and a source electrode 105 and a drain electrode 106 each disposed respectively on the metal oxide layer 104. The source electrode 105 and the drain electrode 106 are formed by performing an etching process on a metal layer. However, in the etching process for forming the source electrode 105 and the drain electrode 106 of the conventional oxide thin film transistor structure 10, the metal oxide layer 104 disposed below the source electrode 105 and the drain electrode 106 tends to be corroded by the etching solution used in the process. Thus, a electrically open may be formed in the metal oxide layer 104.

Therefore, there is a need for improving the quality and production yield of the oxide thin film transistor by preventing a metal etching solution from corroding the metal oxide layer while etching the source electrode and the drain electrode.

SUMMARY

Accordingly, the present invention provides a method for forming an oxide thin film transistor. The quality and production yield of the oxide thin film transistor are improved by using a gray-level mask to form a photo-resist layer on a metal oxide layer to prevent the metal oxide layer from corroding by a metal etching solution and hydrogen doping.

The present invention discloses a method for forming an oxide thin film transistor. According to the method, a substrate is provided. A gate electrode is disposed on the substrate. A semiconductor insulation layer is disposed on the gate electrode. A metal oxide layer is disposed on the semiconductor insulation layer. A first patterned photo-resist layer is disposed on the metal oxide layer. The first patterned photo-resist layer is formed by a gray-level mask. Subsequently, the first patterned photo-resist layer is used as a mask to etch the metal oxide layer to form a patterned metal oxide layer. A part of first patterned photo-resist layer is removed to form a second patterned photo-resist layer. A metal layer is disposed on the semiconductor insulation layer, the patterned metal oxide layer, and the second patterned photo-resist layer. A third patterned photo-resist layer is disposed on the metal layer. Subsequently, the third patterned photo-resist layer is used as a mask to etch the metal layer to form a source region and a drain region and to expose the second patterned photo-resist layer. The third patterned photo-resist layer and a part of the second patterned photo-resist layer are removed to form a fourth patterned to photo-resist layer.

In an embodiment, the method for forming an oxide thin film transistor further comprises forming a contact hole layer on the fourth patterned photo-resist layer and the metal layer, and forming an ohmic contact on the source region and the drain region.

In an embodiment, the first patterned photo-resist layer has a first region with a first thickness and a second region with a second thickness. The first thickness is larger than the second thickness. The metal oxide layer corresponding to the first region is used to form a channel region. The metal oxide layer corresponding to the second region is used to form the source region and the drain region.

In an embodiment, removing a part of first patterned photo-resist layer involves removing the second region from the first patterned photo-resist layer to form the second patterned photo-resist layer. The second patterned photo-resist layer has a third thickness in the first region. The third thickness is larger than the second thickness. The metal oxide layer corresponding to the second patterned photo-resist layer is used to form the channel region. The ratio of the first thickness, the second thickness and the third thickness is 3:1:2.

In an embodiment, the fourth patterned photo-resist layer has a fourth thickness. The metal oxide layer corresponding to the fourth patterned photo-resist layer is used to form the channel region.

In an embodiment, the metal layer is etched by a wet etching process.

Accordingly, the quality and production yield of the oxide thin film transistor are improved by using a gray-level mask to form a photo-resist layer with different thicknesses on the metal oxide layer to prevent the metal oxide layer from corroding by the metal etching solution while a wet etching process is performed on the metal layer, and from being damaged by the hydrogen doping process when the contact hole is formed.

BRIEF DESCRIPTION OF THE DRAWINGS

In order to make the foregoing as well as other aspects, features, advantages, and embodiments of the present disclosure more apparent, the accompanying drawings are described as follows.

DETAILED DESCRIPTION

Figure 1:
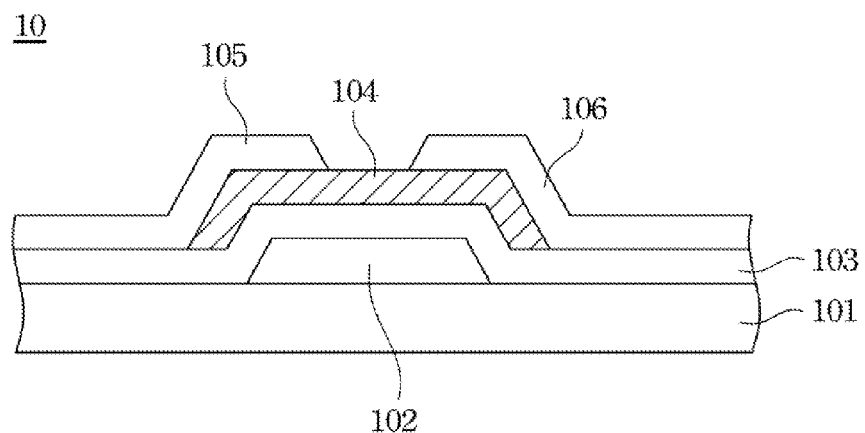
FIG. 1 illustrates a cross-sectional view of a conventional metal oxide thin film transistor structure.

Reference will now be made in detail to the present embodiments of the disclosure, examples of which are illustrated in the accompanying drawings. Wherever possible, the same reference numbers are used in the drawings and the description to refer to the same or like parts.

Figure 13:
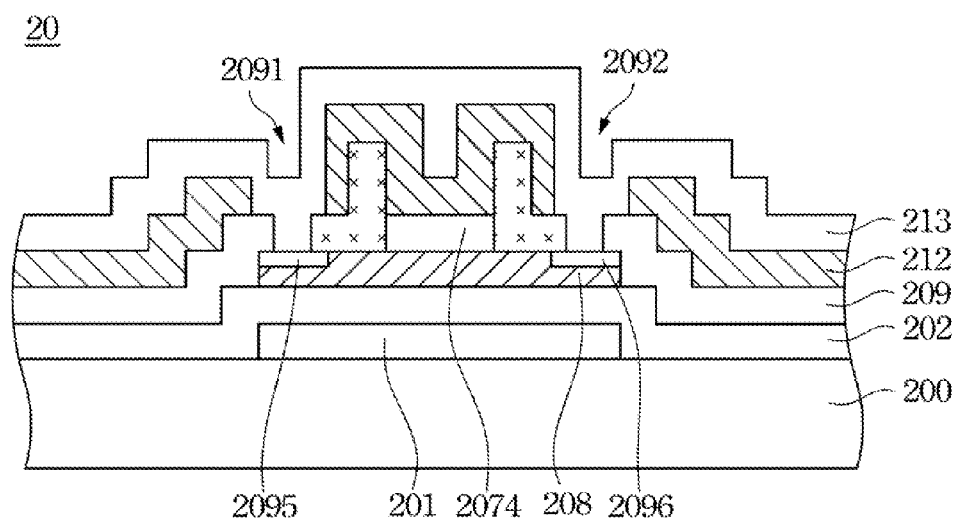

Reference is first made to FIG. 13 which schematically illustrates a cross-sectional view of an oxide thin film transistor structure according to an embodiment of the present invention. As shown in FIG. 13, the oxide thin film transistor structure 20 includes a substrate 200. A gate electrode 201 is disposed on the substrate 200. A semiconductor insulation layer 202 is disposed on the substrate 200 and the gate electrode 201. A metal oxide layer 208 is disposed on the semiconductor insulation layer 202. A photo-resist layer 2074, a source region 2091, and a drain region 2092 are disposed on the metal oxide layer 208. The source region 2091 and the drain region 2092 are respectively disposed on two sides of the metal oxide layer 208. An area of the metal oxide layer 208 corresponding to the photo-resist layer 2074 is a channel region. In addition, the source region 2091 and the drain region 2092 are made of a metal layer 209. A contact hole layer 212 is disposed on the metal layer 209 and the photo-resist layer 2074 to expose the source region 2091 and the drain region 2092. The contact hole layer 212 is a protection layer. Typically, the deposition of a silicon nitride (SiNx) layer using a chemical vapor deposition method is used as the contact hole layer 212. A transparent conductive layer 213 is disposed on the contact hole layer 212. A photolithographic etching process is performed on the transparent conductive layer 213 to form the pixel electrode of a display. In this embodiment, the metal oxide layer 208 can be an indium gallium zinc oxide (IGZO) layer, but the metal oxide layer is not limited in this regard. For example, the metal oxide layer 208 also can include indium, zinc, tin, gallium, lead, germanium, cadmium, or an oxide compound thereof, such as indium zinc oxide and zinc tin oxide, but the metal oxide layer 208 is not limited in this regard.

Reference is now made to FIG. 2 through FIG. 13 which schematically illustrate a method of forming the oxide thin film transistor structure according to an embodiment of the present invention.

Figure 2:
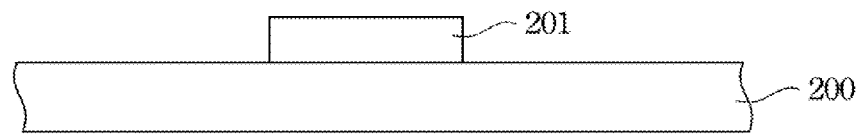
FIG. 2 to FIG. 13 illustrate a fabrication method to form an oxide thin film transistor structure in accordance with an embodiment of the present invention.

As shown in FIG. 2, a substrate 200 is provided. Subsequently, a metal layer is formed on the substrate 200, and a gate electrode 201 is formed by, for instance, performing a photolithography and etching process on the metal layer, but the gate electrode 201 is not limited to being formed by such processes.

Figure 3:
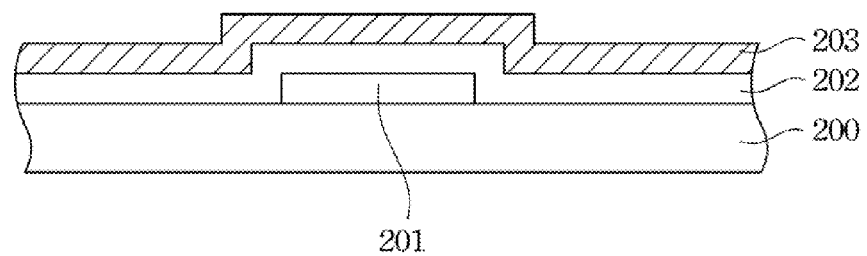

As shown in FIG. 3, a semiconductor insulation layer 202 is formed on the substrate 200 and the gate electrode 201. Subsequently, a metal oxide layer 203 is formed on the semiconductor insulation layer 202. According to this embodiment, the metal oxide layer 203 is formed by performing a vacuum sputtering process to deposit an indium gallium zinc oxide layer on the semiconductor insulation layer 202, but the metal oxide layer 203 is not limited to being formed by such a process. For example, the metal oxide layer 203 also can be made of an oxide material including indium, zinc, tin, gallium, lead, germanium, cadmium, or an oxide compound thereof, such as indium zinc oxide and zinc tin oxide, but is not limited in this regard. Additionally, in this embodiment, the metal oxide layer 203 is deposited on the semiconductor insulation layer 202 by performing a vacuum sputtering process, but the metal oxide layer 203 is not limited to such deposition. The metal oxide layer 203 also can be formed on the semiconductor insulation layer 202 by, for example, galvanic process, or by other processes.

Figure 4:
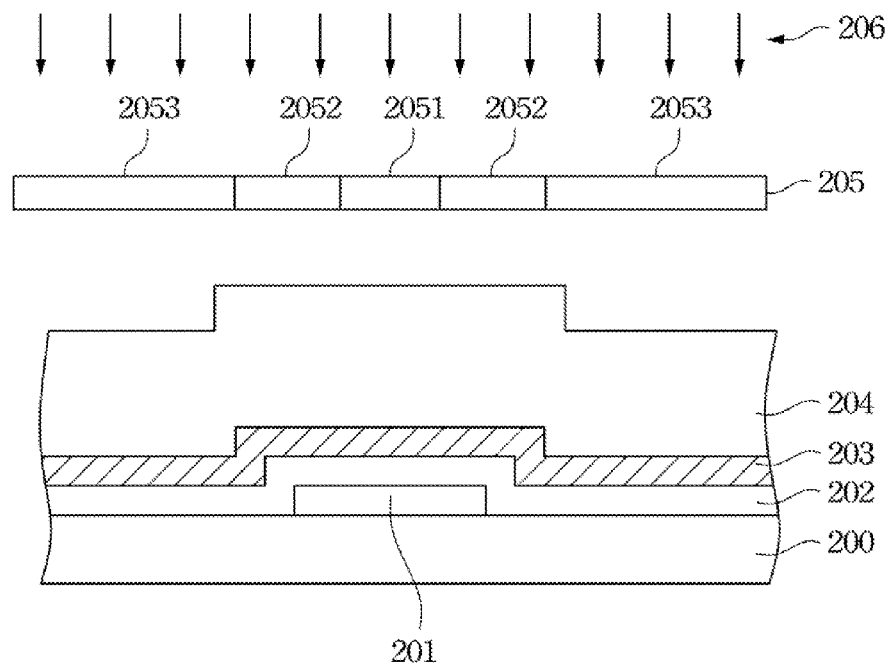

As shown FIG. 4, a photo-resist layer 204 is deposed on the metal oxide layer 203. In this embodiment, the photo-resist layer 204 is made of a resin, a photosensitive agent and a solvent. Next, a light source 206 and a gray level mask 205 are used to perform an exposure process on the photo-resist layer 204. In this embodiment, the gray level mask 205 is placed between the light source 206 and the photo-resist layer 204. The light source 206, for example, is a uniform ultraviolet light source. The gray level mask 205 is formed with a number of regions on a transparent substrate, each of which has different light transmittance. When light passes through the gray level mask 205 with different to light-transmittances, the photo-resist layer 204 disposed below the gray level mask 205 is exposed to different exposure degrees based on the regions of the gray level mask 205, thereby forming a patterned photo-resist layer having different thicknesses.

Figure 5:
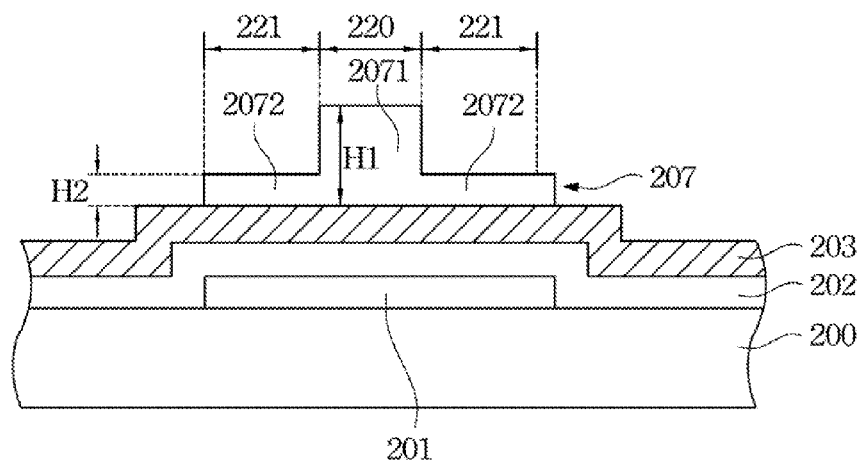

In this embodiment, a gray-level mask 205 is used to form a photo-resist layer 204 with different thicknesses on the metal oxide layer 203 to protect the metal oxide layer 203 from corroding by a metal etching solution while a wet etching process is performed on a metal layer to form a source region and a drain region. Accordingly, the gray level mask 205 is formed with three mask areas 2051, 2052 and 2053 on a transparent substrate, and each mask area has a different light transmittance. In an embodiment, the light transmittance of the mask area 2053 is higher than that of the mask area 2052, and the light transmittance of the mask area 2052 is higher than that of the mask area 2051. Therefore, after the developing process is performed, an area of the photo-resist layer 204 corresponding to the mask area 2053 is completely removed, while areas of the photo-resist layer 204 corresponding to the mask area 2051 and the mask area 2052 is retained on the metal oxide layer 203 and have different thicknesses, as shown in FIG. 5. That is, a first patterned photo-resist layer 207 is formed. Because the light transmittance of the mask area 2052 is higher than that of the mask area 2051, the first patterned photo-resist layer 207 has two regions with different thicknesses, namely, a first region 220 with a first thickness H1 and a second region 221 with a second thickness H2, after developing. The first region 220 of the first patterned photo-resist layer 207 corresponds to the channel region, and the second region 221 of the first patterned photo-resist layer 207 corresponds to the source region and the drain region. The first thickness H1 is three times the second thickness H2. That is, the thickness ratio of the photo-resist layer 2071 to the photo-resist layer 2072 is about 3:1, i.e., the ratio of the first thickness H1 to the second thickness H2 is about 3:1

Figure 6:
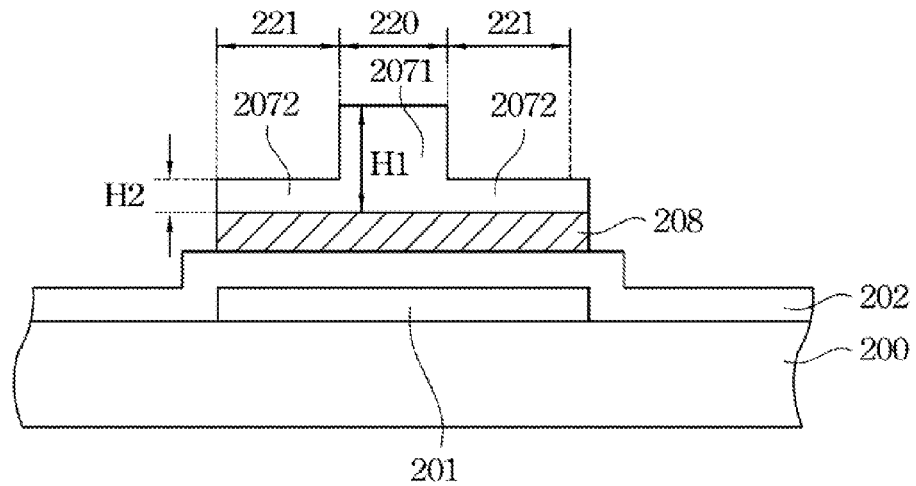
Figure 7:
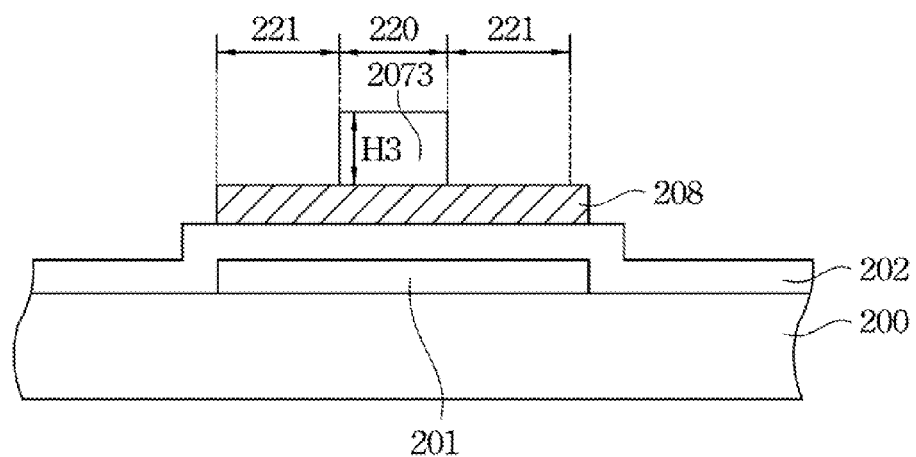

As shown FIG. 6, the metal oxide layer 203 is etched to form a patterned metal oxide layer 208 by using the first patterned photo-resist layer 207 as a mask. Subsequently, as shown in FIG. 7, an ashing process is performed on the first patterned photo-resist layer 207 to remove the photo-resist layer 2072 and expose a part of the surface of the patterned metal oxide layer 208. In an embodiment, because the thickness of the photo-resist layer 2071 is three times thickness of the photo-resist layer 2072, some of the photo-resist layer 2071 in the first region 220 is retained on the patterned metal oxide layer 208 to act as a second patterned photo-resist layer 2073 after the photo-resist layer 2072 is removed. The second patterned photo-resist layer 2073 has a third thickness H3. The third thickness H3 is two-thirds of the first thickness H1 of the photo-resist layer 2071. Therefore, the thickness ratio of the photo-resist layer 2071 the photo-resist layer 2072 and the second patterned photo-resist layer 2073 is 3:1:2, i.e., the ratio of the first thickness H1 the second thickness H2 and the third thickness H3 is about 3:1:2.

Figure 8:
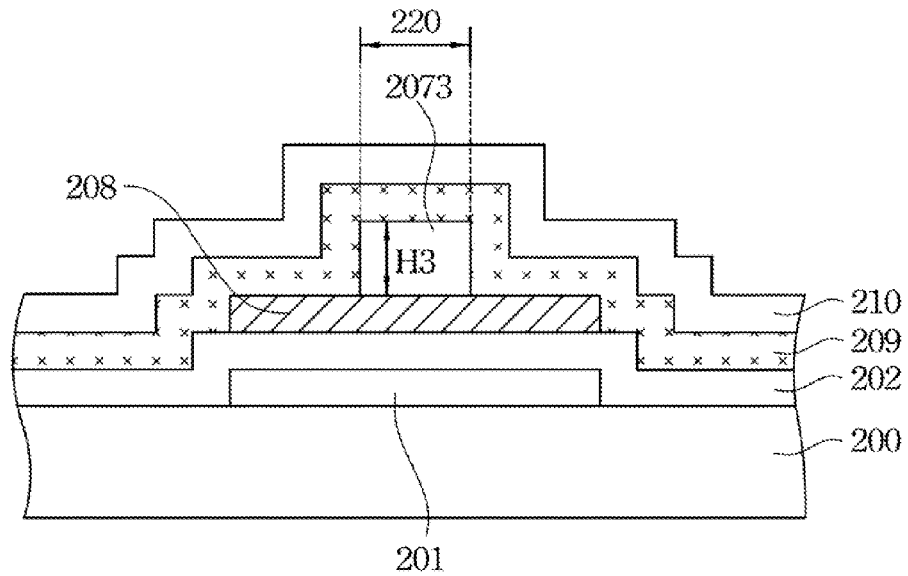

As shown FIG. 8, a metal layer 209 is formed on the patterned metal oxide layer 208, the second patterned photo-resist layer 2073 and the semiconductor insulation layer 202. Subsequently, a photo-resist layer 210 is formed on the metal layer 209. In an embodiment, the thickness of the photo-resist layer 210 is less than that of the second patterned photo-resist layer 2073. In this embodiment, the metal layer for forming each of the gate electrode 201 and the metal layer 209 can be a single-layered metal layer made of a material including aluminum, molybdenum, titanium, chromium, copper, and an alloy thereof or a compound thereof, and can be also a composite-layered metal layer, in which case the materials of the composite-layered metal layer include at least two of aluminum, molybdenum, titanium, chromium, copper, alloys thereof, and compounds thereof.

Figure 9:
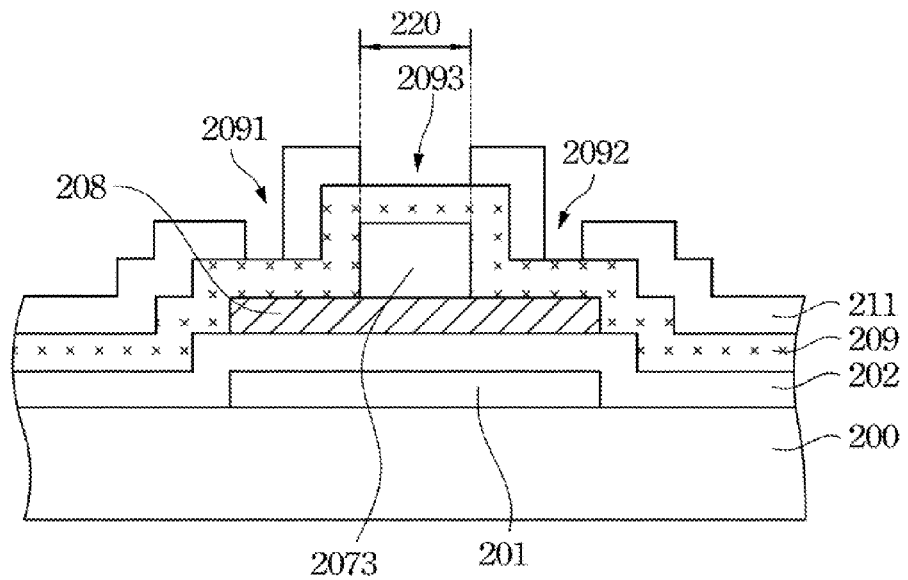
Figure 10:
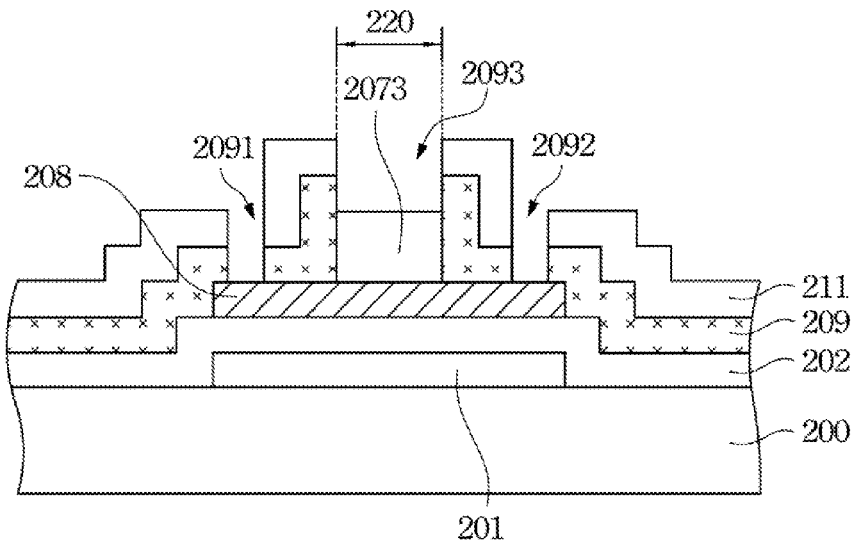

As shown in FIG. 9, a photolithography process is performed on the photo-resist layer 210 to form a third patterned photo-resist layer 211 to define a source region 2091, a drain region 2092 and a channel region 2093. As shown in FIG. 10, the metal layer 209 is etched by using the third patterned photo-resist layer 211 as a mask. For example, the source region 2091, the drain region 2092 and the channel region 2093 are formed by performing a wet etching process to remove a part of the metal layer 209 that is not covered by the third patterned photo-resist layer 211. When the wet etching process is performed, the metal oxide layer 208, which acts as the channel region, is protected by the second patterned photo-resist layer 2073.

Figure 11:
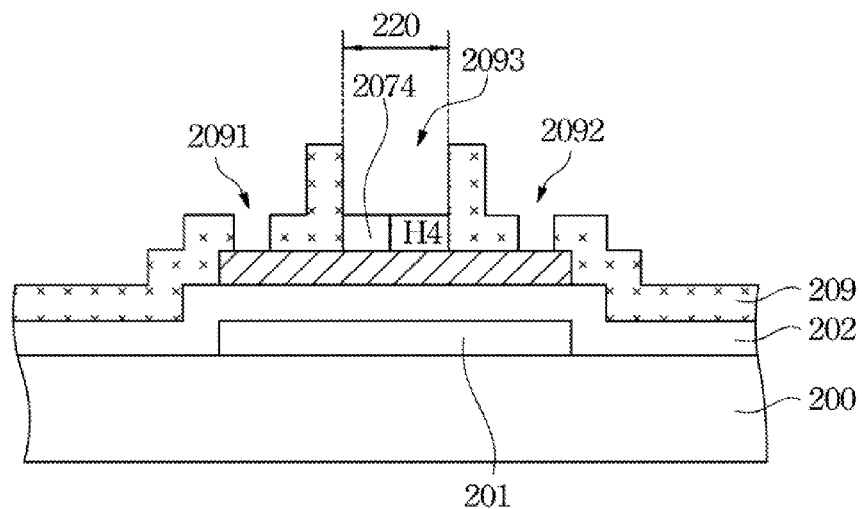

As shown in FIG. 11, an ashing process is performed on the third patterned photo-resist layer 211. At this time, a part of the second patterned photo-resist layer 2073 is removed too. Because the thickness of the photo-resist layer 210 is less than that of the second patterned photo-resist layer 2073, that is, the thickness of the third patterned photo-resist layer 211 is less than that of the second patterned photo-resist layer 2073, some of the photo-resist layer 2073 in the first region 220 is retained on the patterned metal oxide layer 208 to act as a fourth patterned photo-resist layer 2074 after the ashing process is finished. The fourth patterned photo-resist layer 2074 has a fourth thickness H4. In an embodiment, the thickness of the fourth patterned photo-resist layer 2074 is half that of the second patterned photo-resist layer 2073. That is, the fourth thickness H4 is half of the third thickness H3. Therefore, the thickness ratio of the photo-resist layer 2071, the second patterned photo-resist layer 2073 and the fourth patterned photo-resist layer 2074 is 3:2:1, i.e., the ratio of the first thickness H1, the third thickness H3 and the fourth thickness H4 is about 3:2:1. In another embodiment, the photo-resist layer 210 and the second patterned photo-resist layer 2073 are formed by different developing velocity photo-resist material. Accordingly, it is not necessary to limit the thickness of the photo-resist layer 210 to less than that of the second patterned photo-resist layer 2073.

Figure 12:
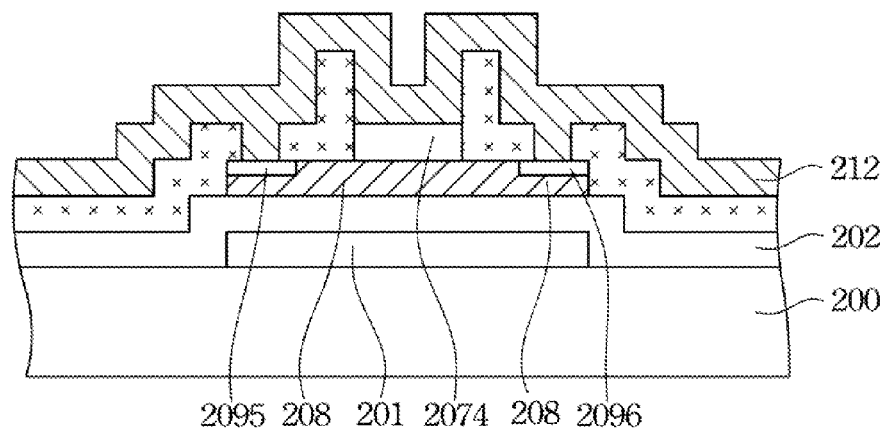

As shown in FIG. 12, a contact hole (CH) layer 212 is formed on the photo-resist layer 2074 and the metal layer 209, and ohmic contacts 2095 and 2096 are formed on the source region 2091 and drain region 2092. The contact hole (CH) layer 212 is a protection layer. Typically, the deposition of a silicon nitride (SiNx) layer using a chemical vapor deposition method is used as the contact hole layer 212. The fabricating process of the contact hole (CH) layer 212 and ohmic contacts 2095 and 2096 involves hydrogen doping. However, if hydrogen doping is performed with respect to the metal oxide layer 208, the metal oxide layer 208 will become a conductive layer, which will result in the transistor failing. Therefore, in the embodiment, the photo-resist layer 2074 covers the area of the metal oxide layer 208 that acts as a channel region 2074 to prevent hydrogen doping of the metal oxide layer 208.

Subsequently, as shown in FIG. 13, the contact hole layer 212 is patterned to expose the source region 2091 and drain region 2092 region. A to transparent conductive layer 213 is deposited on the contact hole layer 212 to act as the pixel electrode and the conductive electrode. The material of the transparent conductive layer 213 is an Indium Zinc Oxide (IZO) or Indium Tin Oxide (ITO) transparent conductive film. Finally, the transparent conductive layer 213 is patterned to complete the wire connection structure and the pixel electrode.

Accordingly, a gray level mask is used to form a photo-resist layer with different thicknesses on the metal oxide layer. The photo-resist layer on the metal oxide layer which acts as a channel region has the maximum thickness, thereby preventing the metal etching solution from corroding the metal oxide layer while a wet etching process is performed on the metal layer. Moreover, this photo-resist layer also acts as a stopping layer when a contact hole is deposed on the metal oxide layer to thereby prevent hydrogen doping of the metal oxide layer that would otherwise result in the metal oxide layer becoming a conductive layer. As a result, the quality and production yield of the oxide thin film transistor are improved.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for forming an oxide thin film transistor, comprising the following steps:
   providing a substrate;
   forming a gate electrode on the substrate;
   forming a semiconductor insulation layer on the gate electrode;
   forming a metal oxide layer on the semiconductor insulation layer;
   forming a first patterned photo-resist layer on the metal oxide layer, wherein the first patterned photo-resist layer is formed by a gray-level mask;
   using the first patterned photo-resist layer as a mask to etch the metal oxide layer to form a patterned metal oxide layer;
   removing a part of the first patterned photo-resist layer to form a second patterned photo-resist layer;
   forming a metal layer on the semiconductor insulation layer, the patterned metal oxide layer, and the second patterned photo-resist layer;
   forming a third patterned photo-resist layer on the metal layer;
   using the third patterned photo-resist layer as a mask to etch the metal layer to form a source region and a drain region and to expose the second patterned photo-resist layer; and
   removing the third patterned photo-resist layer and a part of the second patterned photo-resist layer to form a fourth patterned photo-resist layer.

2. The method of claim 1, further comprising the steps of forming a contact hole layer on the fourth patterned photo-resist layer and the metal layer, and forming ohmic contacts on the source region and the drain region.

3. The method of claim 1, wherein the first patterned photo-resist layer has a first region with a first thickness and a second region with a second thickness, and the first thickness is larger than the second thickness.

4. The method of claim 3, wherein the metal oxide layer corresponding to the first region acts as a channel region, and the metal oxide layer corresponding to the second region acts as the source region and the drain region.

5. The method of claim 3, wherein the step of removing a part of the first patterned photo-resist layer to form a second patterned photo-resist layer further comprises removing the second region from the first patterned photo-resist layer to form the second patterned photo-resist layer,
 wherein the second patterned photo-resist layer has a third thickness in the first region, and the third thickness is larger than the second thickness,
 wherein the metal oxide layer corresponding to the second patterned photo-resist layer acts as the channel region.

6. The method of claim 5, wherein a ratio of the first thickness, the second thickness and the third thickness is 3:1:2.

7. The method of claim 6, wherein the fourth patterned photo-resist layer has a fourth thickness, and the metal oxide layer corresponding to the fourth patterned photo-resist layer acts as the channel region.

8. The method of claim 7, wherein a ratio of the first thickness, the third thickness and the fourth thickness is 3:2:1.

9. The method of claim 1, wherein the metal layer is etched by a wet etching process.

* * * * *